United States Patent
Lee et al.

[11] Patent Number: 5,903,021
[45] Date of Patent: May 11, 1999

[54] PARTIALLY PINNED PHOTODIODE FOR SOLID STATE IMAGE SENSORS

[75] Inventors: Teh-Hsuang Lee, Webster; Robert M. Guidash, Rush; Paul P. Lee, Pittsford, all of N.Y.

[73] Assignee: Eastman Kodak Company, Rochester, N.Y.

[21] Appl. No.: 08/785,555

[22] Filed: Jan. 17, 1997

[51] Int. Cl.[6] .................. H01L 31/068; H01L 31/103
[52] U.S. Cl. .................. 257/292; 257/223; 257/230; 257/233; 257/445
[58] Field of Search .................. 257/223, 230, 257/233, 292, 445

[56] References Cited

U.S. PATENT DOCUMENTS

| | | | |
|---|---|---|---|
| 4,333,111 | 6/1982 | Noda et al. | 358/213 |
| 4,413,284 | 11/1983 | Izumita et al. | 358/213 |
| 4,484,210 | 11/1984 | Shiraki et al. | 357/24 |
| 4,809,075 | 2/1989 | Akimoto et al. | 358/213.18 |
| 4,908,518 | 3/1990 | Losee et al. | 358/213 |
| 4,984,047 | 1/1991 | Stevens | 357/30 |
| 5,051,797 | 9/1991 | Erhardt | 357/24 |
| 5,060,245 | 10/1991 | Nelson | 377/60 |
| 5,115,458 | 5/1992 | Burkey et al. | 377/58 |
| 5,181,093 | 1/1993 | Kawaura | 257/233 |
| 5,182,623 | 1/1993 | Hynecek | 257/233 |
| 5,235,196 | 8/1993 | Anagnostopoulos et al. | 257/223 |
| 5,235,198 | 8/1993 | Stevens et al. | 257/232 |
| 5,256,891 | 10/1993 | Losee et al. | 257/233 |
| 5,306,931 | 4/1994 | Stevens | 257/223 |
| 5,337,340 | 8/1994 | Hynecek | 377/60 |
| 5,359,213 | 10/1994 | Lee et al. | 257/223 |
| 5,365,093 | 11/1994 | Kuno | 257/233 |
| 5,471,515 | 11/1995 | Fossum et al. | 377/60 |
| 5,514,887 | 5/1996 | Hokari | 257/233 |
| 5,675,158 | 10/1997 | Lee | 257/233 |

FOREIGN PATENT DOCUMENTS

| | | | |
|---|---|---|---|
| 0 544 260 A1 | 11/1992 | European Pat. Off. | H01L 27/148 |
| 0 738 010 A2 | 10/1996 | European Pat. Off. | H01L 27/148 |
| 61-125081 | 6/1986 | Japan | H01L 29/76 |
| 62-160750 | 7/1987 | Japan | H01L 27/04 |
| 63-299268 | 12/1988 | Japan | H01L 27/14 |
| 1-135184 | 5/1989 | Japan | H04N 5/335 |
| 3-161964 | 7/1991 | Japan | H01L 27/06 |

OTHER PUBLICATIONS

Yoshimitsu Hiroshima, Semiconductor Research Lab, Matsushita Electronics Corp., pp. 1–4, English Translation of Japanese Article.

B.C. Burkey, et al., "The Pinned Photodiode For An Interline–Transfer CCD Image Sensor," 1984 IEDM.

Sunetra Mendis, et al., "CMOS Active Pixel Image Sensor," 1994 IEEE.

Fumihiko Ando, et al., "Amplifying Solid–State Image Pickup Element AMI," vol. 41, No. 11, 1987, English Translation.

Kazuya Matsumoto, et al., "The Operation Mechanism of a Change Modulation Device (CMD) Image Sensor" 1991 IEEE.

(List continued on next page.)

*Primary Examiner*—Jerome Jackson, Jr.
*Attorney, Agent, or Firm*—James D. Leimbach

[57] ABSTRACT

A pixelated image sensor having comprising a partially pinned photodiode which is formed a semiconductor of a first conductivity type formed on a surface of the sensor with at least one photodiode formed, within the semiconductor near the surface, the photodiode being formed from a second conductivity type opposite the first conductivity type; a pinning layer formed on the surface over at least a portion of the photodiode creating a pinned photodiode region, the pinning layer being formed from the first conductivity type; and an unpinned region formed near the surface in an area outside the portion used to form the pinning layer, the unpinned region is formed as a floating region that is employed as a capacitor. The partially pinned photodiode is useful in expanding the fill factor of photodetectors employing photodiode technology.

26 Claims, 7 Drawing Sheets

OTHER PUBLICATIONS

Kazuya Matsumoto, et al., "Analysis of Operational Speed and Scaling Down the Pixel Size of a Charge Modulation Device (CMD) Image Sensor," 1991 IEEE, vol. 38, No. 5.

Masanori Ogata, et al., "A Small Pixel CMD Image Sensor," 1991 IEEE, vol. 38, No. 5.

Jaroslav Hynecek, "BCMD–An Improved Photosite Structure for High–Density Image Sensors,", 1991 IEEE, vol. 38, No. 5.

Toyokazu Mizoguchi, "A 250 k–Pixel SIT Image Sensor Operating in its High–Sensitivity Mode," 1991 IEEE vol. 38, No. 5.

Yoshio Nakamura, et al., 1991 IEEE, Design of Bipolar Imaging Device (BASIS), vol. 38, No. 5.

Mamoru Miyawaki, et al., "Reduction of Fixed–Pattern Noise of BASIS Due to Low Kinetic Energy Reactive Ion and Native–Oxide–Free Processing," 1991 IEEE, vol. 38, No. 5.

Yoshiyuki Matsunaga, et al., "A High–Sensitivity MOS Photo–Transistor for Area Image Sensor," 1991 IEEE, vol. 38, No. 5.

E. Fossum, Active Pixel Sensors: Are CCD's Dinosaurs?, SPIE vol. 1900–08–8194–1133.

R.H. Nixon, S.E. kemeny, C.O. Staller, and E.R. Fossum, "128x128 CMOS Photodiode–type Active Pixel Sensor with On–chip Timing, Control and Signal Chain Electronics". Proceedings of the SPIE vol. 2415, Charge–Coupled Devices and Solid–State Optical Sensors V, paper 34 (1995).

H.S. Philip Wong, "Technology And Device Scaling Considerations for CMOS Imagers". IEEE Solid State Circuits Technology Workshop on CMOS Imaging Technology, Feb. 7, 1996, San Francisco, CA.

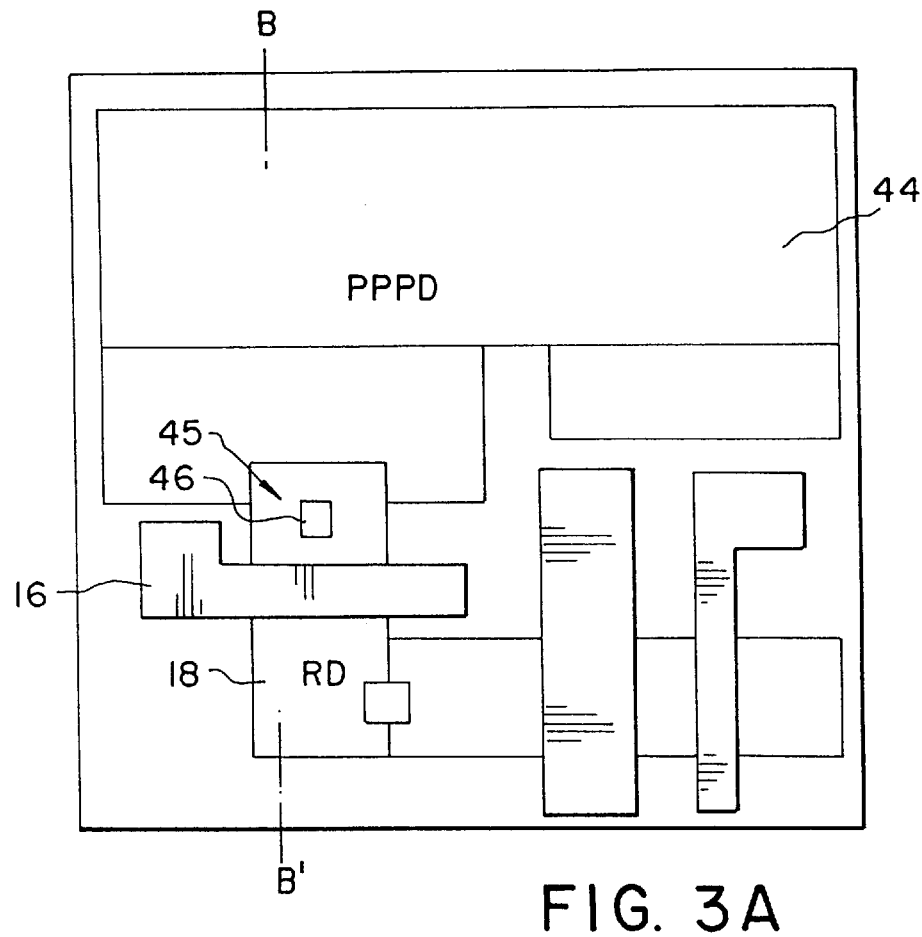
FIG. 3A
FIG. 3B
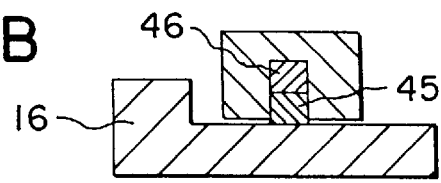
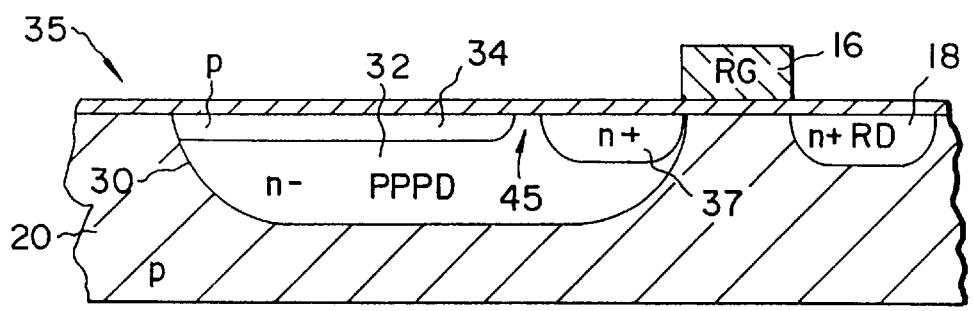
FIG. 4

PARTIALLY PINNED PHOTODIODE FOR SOLID STATE IMAGE SENSORS

CROSS-REFERENCE TO RELATED APPLICATIONS

The present application is related to U.S. application Ser. No. 08/421,173 filed Apr. 13, 1995, by the same inventors as the present application, and entitled, "ACTIVE PIXEL SENSOR INTEGRATED WITH PINNED PHOTODIODE."

FIELD OF THE INVENTION

The present invention relates to the field of solid state photo-sensors and imagers, specifically to imagers referred to as Active and Passive Pixel Sensors, and more particularly, to photo-sensing elements within pixels that provide improved dark current, blue quantum efficiency, image lag and fill factor characteristics.

BACKGROUND OF THE INVENTION

Active Pixel Sensors (APS) are solid state imagers wherein each pixel contains a photo-sensing means and some other active devices that perform control functions on the pixel. Passive pixel sensors (PPS) are imagers having photosensing means and address transistor, but no active components. Recent and prior art devices have focused on using commercially available CMOS foundry processes to manufacture APS and PPS devices. The use of CMOS to manufacture APS and PPS devices has a resulting advantage of easily integrating signal processing and control circuits on the same chip as the imager. Thus, making it easier to fabricate a camera on a single semiconductor device, and providing a low cost integrated digital imaging device.

In APS and PPS devices typically fabricated using standard CMOS processes, the photodetector within the pixel has been either a photocapacitor, (also referred to as a photogate), or a photodiode. Photogate detectors have poor blue quantum efficiency due to the absorption of short wavelength light in the gate material, typically polysilicon, that covers the photo-sensing area. Additionally, photogate detectors require a double level polysilicon process to provide reasonable fill factor, (fill factor being defined as the percentage of the entire pixel area that is the photodetector). Double poly processes are not typically available, and are more complex and costly when compared to single level polysilicon processes. Photodiode detectors have high dark current, reduced blue quantum efficiency, and image lag. High dark current is attributable to the use of heavily doped n-type regions, that are typically used as NMOS sources and drains, as the photodiode. In those devices with heavily doped implants, the implant damage is not easily annealed since the goal of CMOS processes is to achieve very shallow sources and drains, having low resistivity. Therefore, the transistor gate length can be minimized and transistor speed maximized. It is not critical for CMOS sources and drains to have low dark current. Additionally, the silicon-silicon/ dioxide interface states can contribute to dark current and recombination of shallow photo-electrons in the photodiode, further increasing dark current and degrading blue quantum efficiency.

Image lag is a phenomenon that exists within many conventional CMOS imagers that can result in ghost image artifacts. Image lag results from the inability to completely reset a photodiode in the short amount of time due to the large capacitance associated within the photodiode and reset by sub-threshold current. This causes photoelectrons to be left within the photodiode and inadvertently be read as signal electrons corresponding to the next frame in the image sequence, causing ghost images. These deficiencies described above lead to image quality that is not suitable for many digital imaging applications.

A pinned photodiode APS and PPS was disclosed by P. Lee et al. in allowed U.S. patent application Ser. No. 08/421,173. This disclosure illustrates an active pixel sensor that overcomes the limitations of the photodetectors previously discussed. However the pinned photodiode APS and PPS device has a smaller fill factor than a photodiode based APS and PPS device, which results in lower overall sensitivity.

From the foregoing discussion it is apparent that there remains a need within the art to provide an APS and PPS pixel structure that provides low dark current, high blue quantum efficiency, low image lag, and high fill factor.

SUMMARY OF THE INVENTION

The present invention addresses the foregoing problems within the prior art by providing a new APS and PPS pixel, henceforth referred to as a partially pinned photodiode. This pixel comprises a photodiode with a pinned region and an un-pinned region, and means to reset the photodiode. The name "partially pinned photodiode" is used due to the fact that only part of the diode has a pinned surface potential. Since an appreciable portion of the photo-sensitive region has a pinned surface potential, this pixel retains the advantages of the pinned photodiode pixel, low dark current, good blue quantum efficiency and low image lag. In addition, this pixel architecture has a higher fill factor due to the elimination of the transfer gate and floating diffusion regions. Whereas a pinned photodiode pixel has a fill factor of approximately 25%–35%, given the same design rules used to layout the pinned photodiode pixel, the partially pinned photodiode has a fill factor of approximately 50%–60%. It should be noted that some of the increase in fill factor is due to less metal interconnect required in the partially pinned photodiode pixel.

These and other aspects, objects, features, and advantages of the present invention will be more clearly understood and appreciated from a review of the following detailed description of the preferred embodiments and appended claims, and by reference to the accompanying drawings.

ADVANTAGEOUS EFFECT OF THE INVENTION

The advantages compared to prior art pixels are high fill factor, high sensitivity, low dark current, low image lag, good blue quantum efficiency, more efficient antiblooming features and dynamic range compression.

BRIEF DESCRIPTION OF THE DRAWINGS

FIG. 3A is a top view of an APS and PPS sensor as envisioned by the present invention;

FIG. 3B is a top view of an APS and PPS sensor similar to that shown in FIG. 3A with a smaller unpinned region;

FIG. 4 is a cross sectional view of the APS and PPS shown in FIG. 3A, taken through line BB';

FIG. 6A is a cross section of the prior art photodiode shown in;

To facilitate understanding, identical reference numerals have been used, where possible, to designate identical elements that are common to the figures.

DETAILED DESCRIPTION OF THE INVENTION

We have discovered that fill factors and other advantageous features can be improved within a pinned photodiode based active pixel sensor (APS and PPS) by pinning only a portion of the photodiode. The pinned photodiode has many desirable features, however, conventional pinned photodiodes have been unable to provide large fill factors.

Figure 1:
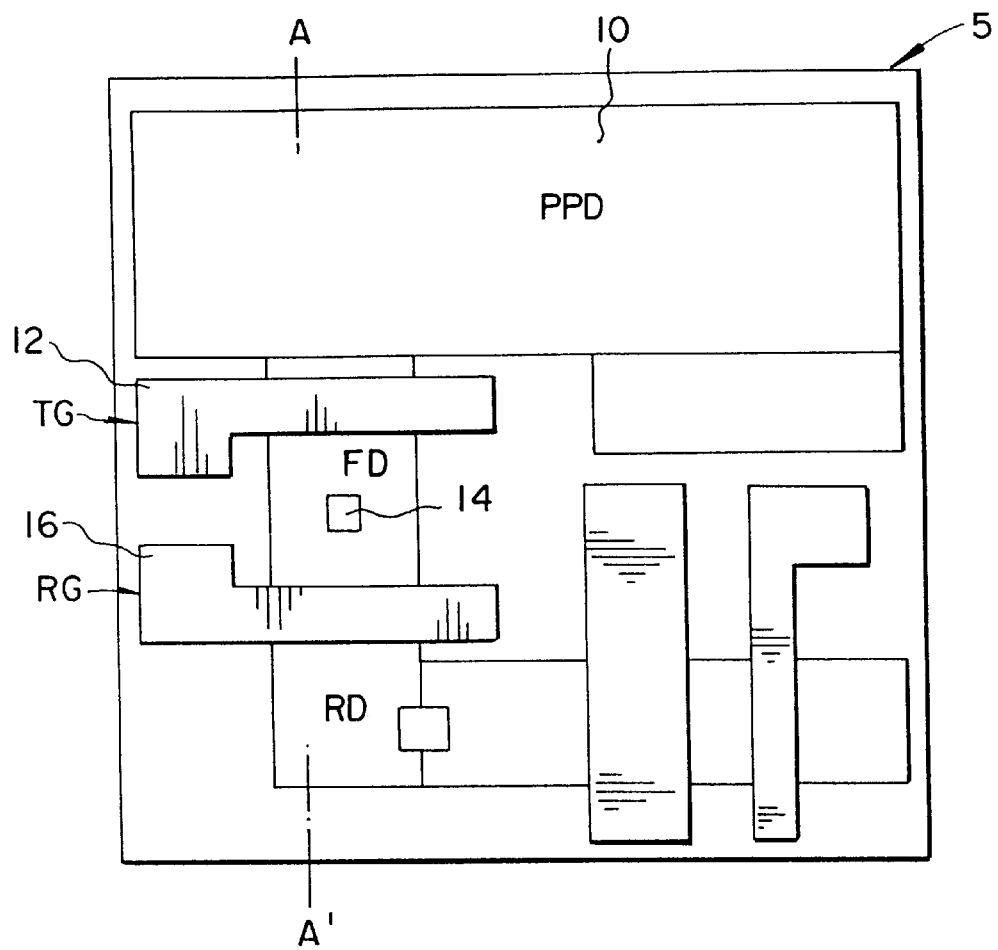
FIG. 1 is a top view of a prior art pinned photodiode based active pixel sensor (APS and PPS)
Figure 2:
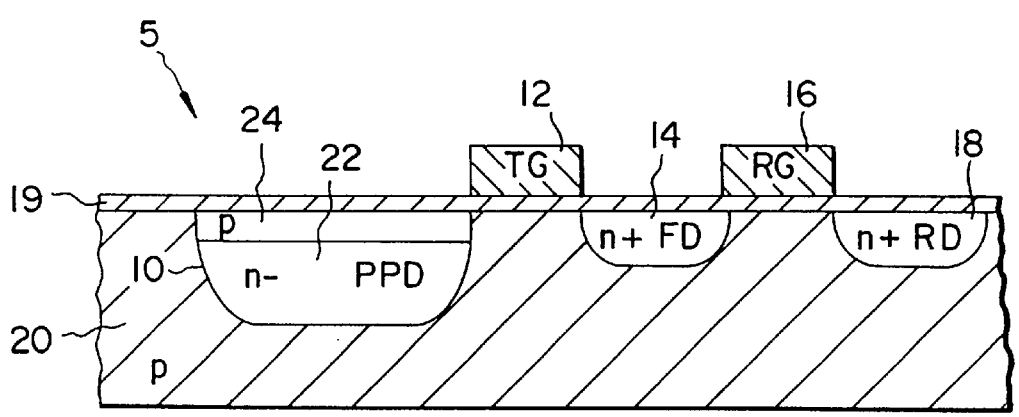
FIG. 2 is a cross sectional view of the prior art APS and PPS shown in FIG. 1, taken through AA'.

Referring to FIG. 1, which a top view of a prior art active pixel 5 having a pinned photodiode 10 in conjunction with FIG. 2, which is a cross section of FIG. 1 through the line labeled AA', the region of interest in the prior art pinned photodiode APS pixel 5 is illustrated. Pixel 5, is formed upon a p-type substrate 20 with a pinned photodiode 10, a transfer gate 12, floating diffusion 14, reset gate 16, and a reset drain 18. The pinned photodiode 10 comprises a lightly doped n-type region 22 within p-type substrate 20 and p-type pinning layer 24. As clearly seen in FIG. 1, a large portion of the area within pixel 5 is used up by other features and not left for the pinned photodiode 10.

The pixel as shown in FIG. 1 is disclosed by Lee et al. in allowed U.S. patent application Ser. No. 08/421,173 and provides low dark current, good blue quantum efficiency, and no image lag. Low dark current is achieved by using an appropriate dose and species of n-type photodiode implant so that all of the implant damage can be annealed with process times and temperatures that are compatible with the rest of the CMOS fabrication process requirements. Additionally low dark current is achieved by providing a p-type layer 24 at the surface 19 that pins the potential of the surface 19 to the potential of the substrate, typically the ground level or 0 volts. This suppresses dark current generation of interface states. Dark current suppression provides improvement in the signal to noise ratio of the photodetector by making the noise electron generation rate a smaller fraction of the photo-electron generation rate.

The fill factor of the pinned photodiode pixel, shown in FIG. 1, is defined as the percentage of the total pixel area that is the photodetector, is less than that typically provided by standard photodiode pixels. This is due to the addition of a transfer gate 12, floating diffusion 14 and associated metal interconnect (not shown). Although inclusion of these structures produces a no image lag, high conversion gain device, these structures occupy surface area that could otherwise be utilized as the photodetector. As a result the fill factor of a pinned photodiode pixel can be as much as two times less than that of a standard photodiode pixel, thus potentially adversely affecting the sensitivity of the device.

The APS pixel as envisioned by the present invention can be seen in FIG. 3A. FIG. 4 is a cross sectional view of FIG. 3A through line BB'. These views illustrate the increase in fill factor achieved by the present invention, which is a result of the partially pinned photodiode architecture. The new pixel 35 comprises a photodiode 30, formed in substrate 20. It should be noted that the substrate 20 used with the present invention is the same substrate type as used with the prior art pinned photodiode previously discussed. However, pixel 35 of the present invention employs both a pinned region 44 and an un-pinned region 45, a combination which is undisclosed by prior art pinned photodiodes. Pinned region 44 is formed by an n-type implant to form n-type region 32 with a p-type pinning layer 34 formed on top of it. N-type region 37 is formed between reset gate 16 and pinned region 44 such that it is within the unpinned region 45. Contact 46 is formed on top of n-type region 37 to provide for the removal of stored charge from photodiode 30. Additionally, a reset gate 16, and a reset drain 18 are provided within the preferred embodiment of the present invention to drain any undesired charge and provide reset of the pixel 35. It will be understood by those skilled in the art that a vertical overflow drain (VOD), not shown, could also be used to provide reset of the pixel 35. A top view of this pixel 35 is shown in FIG. 3A, where it is apparent that an appreciable portion of the photo-sensitive region is encompassed by pinned region 44, with a relatively small area being allotted to unpinned region 45. This pixel 35 substantially retains the advantages of the prior art pinned photodiode pixel. These advantages include low dark current and good blue quantum efficiency. The pixel 35 of the present invention has no transfer gate and lacks a dedicated floating diffusion. Instead the an unpinned region 45 is a floating region near the surface of pixel 35. Since unpinned region 45 is floating, it functions in a manner similar to the floating diffusion illustrated within the prior art pixel.

Referring to FIG. 3B, which is a top view of an APS sensor similar to that shown in FIG. 3A with a smaller unpinned region 45, and advantages of less image lag due to lower capacitance of the unpinned region 45. However, the APS sensor of FIG. 3A has a higher sensitivity due to the larger unpinned region 45 which has a smaller capacitance than the pinned region 44. This will be described in further detail below.

Figure 3C:
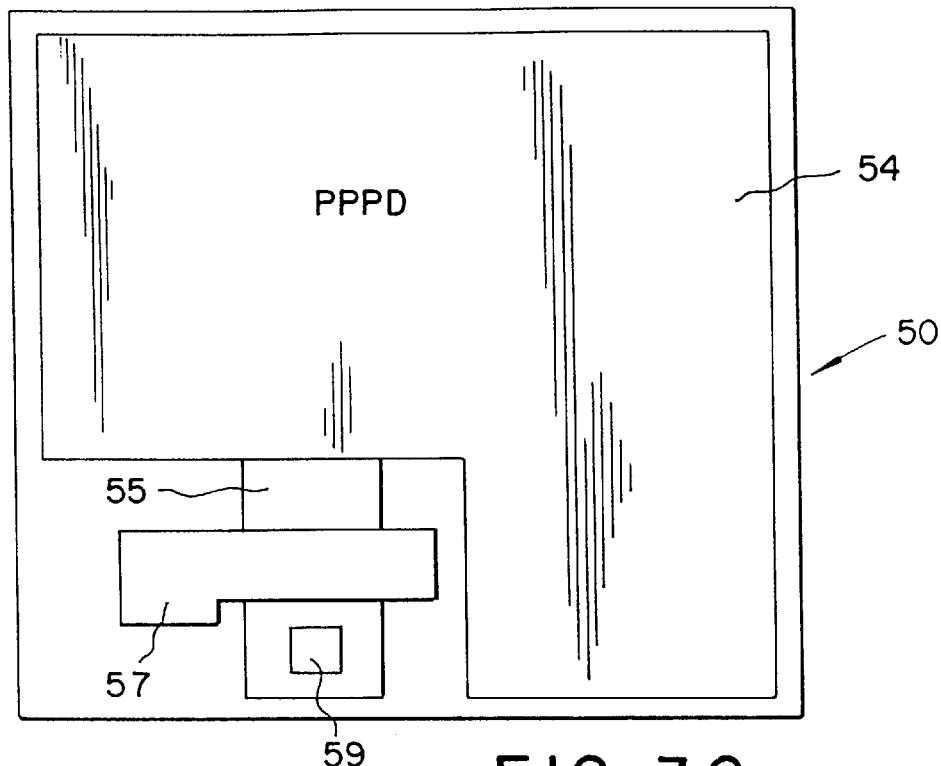
FIG. 3C is a top view of a Passive Pixel Sensor as envisioned by the present invention.

FIG. 3C is a top view of a Passive Pixel Sensor, generally referred to as 50, as envisioned by the present invention. Passive pixel sensors refers to those sensors that do not contain signal amplification means within the pixel, but instead, typically contain passive elements. Passive pixel sensors typically have the photodetector and a switch to connect the photodetector to a signal bus. The unpinned region 55 can function as an integral part of a passive element which could be: a resistor; a capacitor; or a transistor used as a switch. The partially pinned photodiode comprising pinned region 54 and unpinned region 55 functions as the photodetector with the unpinned region 55 being operatively connected to the passive elements. Select gate 57 provides for selection of the pixel and drain 59 removes any undesired stored charge.

Figure 5A:
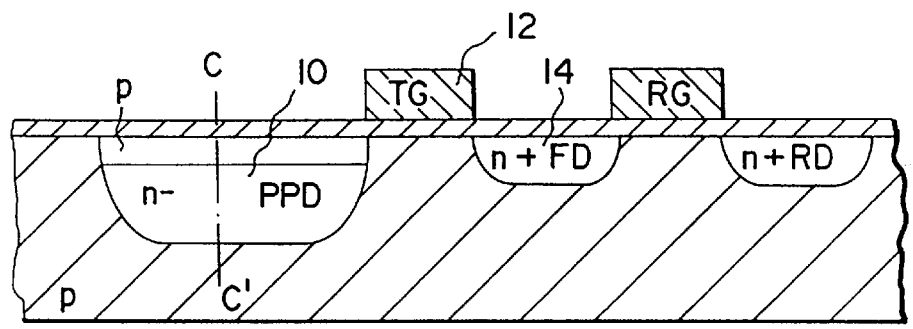
FIG. 5A illustrates the prior art pinned photodiode based sensor as shown in FIG. 2.
Figure 5B:
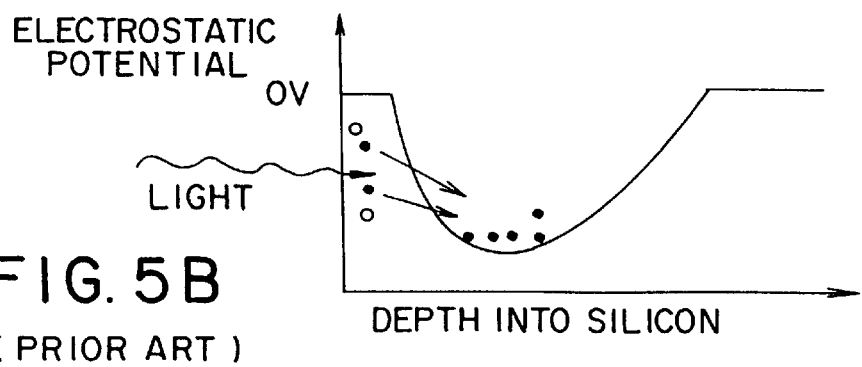
FIG. 5B illustrates the electrostatic potential of the prior art pinned photodiode of FIG. 5A as seen along the line CC'.

FIG. 5B is an illustration of the electrostatic potential profile of the prior art pinned photodiode 10 based APS shown in FIG. 5A along the line C–C'. Pinning the surface potential of the photodiode also improves blue quantum efficiency by providing an electric field that pulls photo-electrons generated at the surface into the electrostatic potential well of the pinned photodiode 10. This is depicted in FIG. 5B. Blue quantum efficiency is also improved by reducing the recombination of shallow photo-electrons through suppression of interface states. Image lag is eliminated by providing a completely depleted pinned photodiode 10 structure, with an electrostatic potential that is shallower than the "on" potential of the transfer gate 12, so that all of the photo-electrons are transferred to the floating diffusion region 14 without entering a sub-threshold regime, by turning on the transfer gate 12.

Figure 6A:
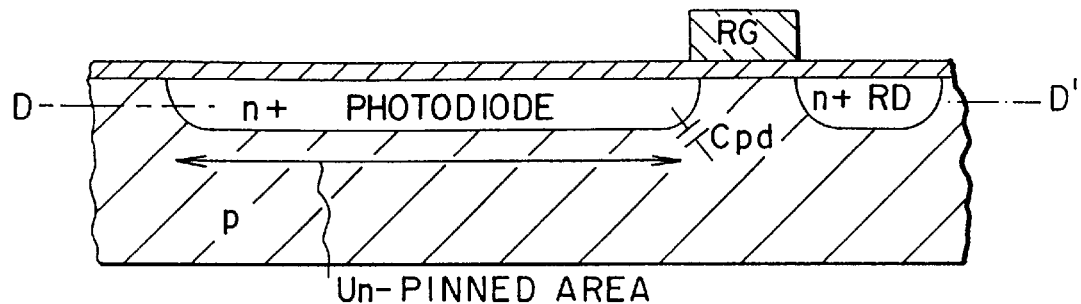
Figure 6B:
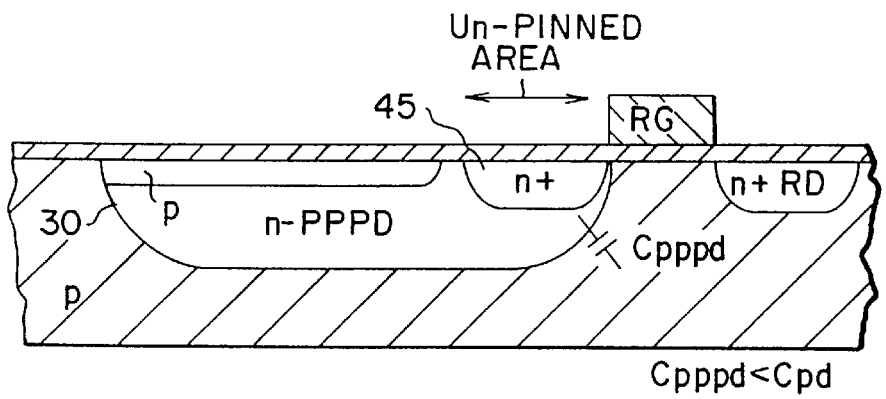
FIG. 6B is a cross section of a partially pinned photodiode shown in FIG. 4.
Figure 6C:
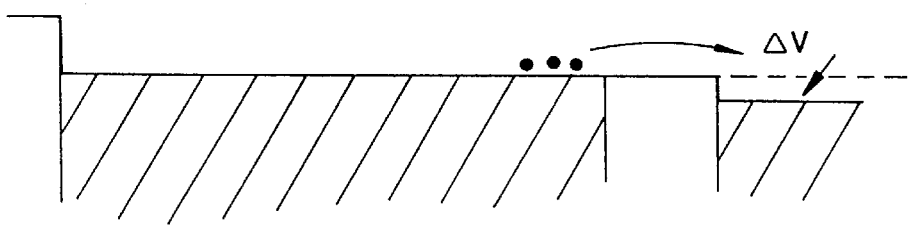
FIG. 6C illustrates the electrostatic potential of the prior art photodiode seen along the line DD' of FIG. 6A.

Image lag in photodiode APS and PPS devices is explained in the following discussion. The electrostatic potential along line D–D' of the standard photodiode in FIG. 6A is shown in FIG. 6C. In APS and PPS devices, it is desirable to have all of the timing and signal levels to be the same as the CMOS logic levels, (i.e. 0 V and 5 V, or 0 V and 3.3 V). It is also desirable to have the reset drain voltage (Vrd) at a level that will maximize the diode signal swing and charge capacity. Therefore, Vrd, is kept as deep as possible by applying the highest potential for the CMOS device, typically this would be the supplied power source (Vdd).

Given these constraints (reset gate on-voltage and Vrd remaining at a potential equal to the CMOS Vdd), it is not possible to make the electrostatic potential of the reset gate as deep as that of the reset drain. This is depicted in FIG. 6C. As a result, in order for the photodiode to be completely reset to the level of the reset drain, the remaining electrons must be removed by subthreshold current. As the photodiode gets reset closer to the level of the reset drain potential, the $\Delta V$ as shown in FIG. 6C gets progressively smaller. Since the subthreshold current is proportional to $e^{\Delta V}$ as $\Delta V$ gets smaller, the subthreshold current gets smaller. It is evident that the photodiode cannot be completely reset in a short period of time. Consequently, if a bright image from a previous frame coincides with a dark image from the present frame, the residual charge from the incomplete reset in the previous frame will be read out and interpreted as signal charge in the present dark area, thus producing a "ghost" image effect. This is an objectionable image artifact in many imaging applications. This problem can be overcome by utilizing a depletion mode reset gate, or by setting Vrd to a lower voltage. However, this also leads to a lower signal swing and charge capacity which is not desirable.

Figure 7A:
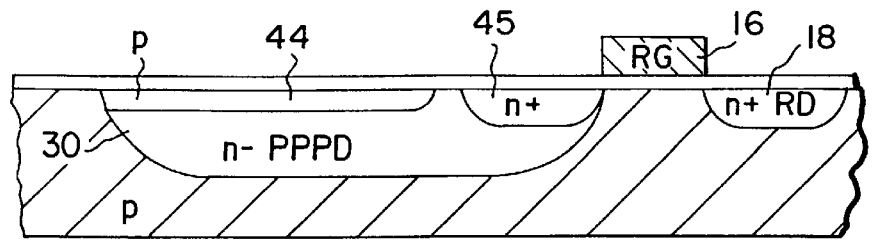
FIG. 7A is the cross section of the partially pinned photodiode based pixel as shown in FIG. 4.
Figure 7B:
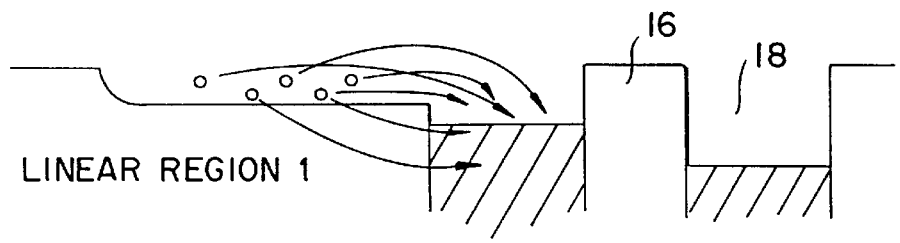
FIG. 7B is an electrostatic potential diagram illustrating the operation of the pixel of FIG. 7A within linear region 1.
Figure 7C:
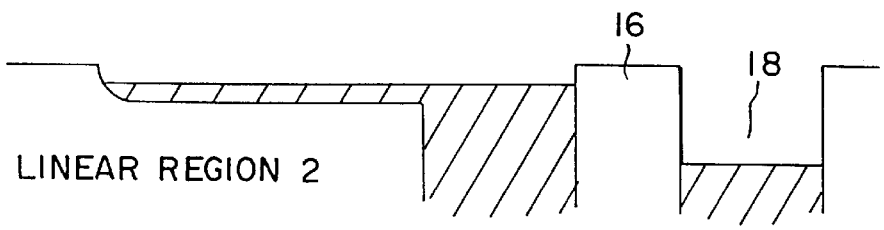
FIG. 7C is an electrostatic potential diagram illustrating the operation of the pixel of FIG. 7A within linear region 2.
Figure 7D:
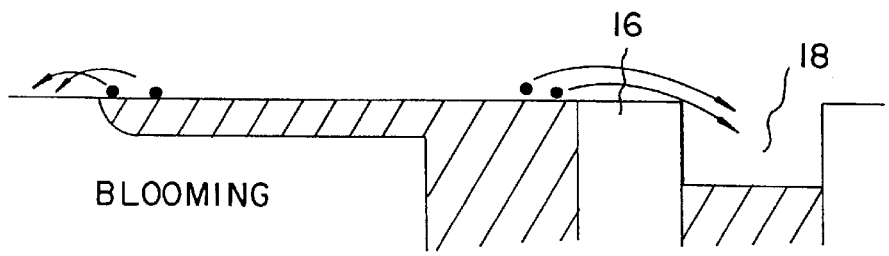
FIG. 7D is an electrostatic potential diagram illustrating blooming of the pixel of FIG. 7A.
Figure 7E:
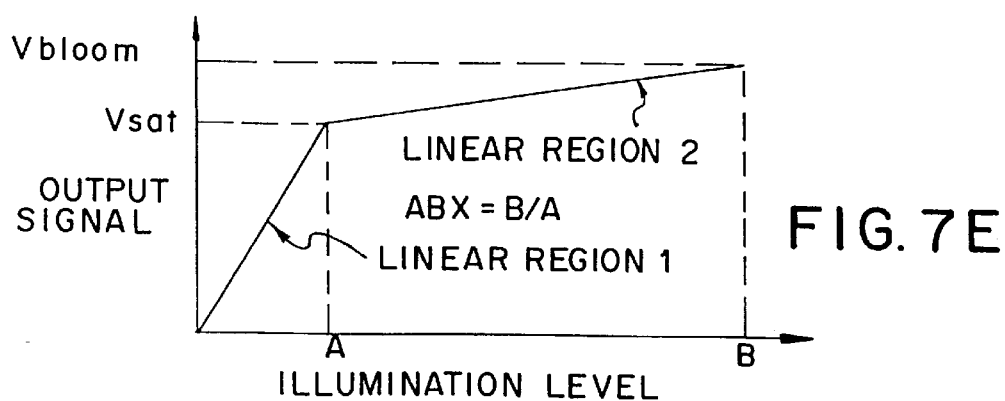
FIG. 7E is a diagram illustrating output voltage versus illumination level of the pixel shown in FIG. 7A.

Although image lag is not entirely eliminated in the partially pinned photodiode pixel, it is substantially less than that produced by a standard photodiode pixel. As shown in FIG. 6B, this is attributable to a smaller capacitance, Cpppd associated with the un-pinned signal charge storage region in the partially pinned photodiode pixel, compared to that of the photodiode pixel. This capacitance is smaller due to the smaller unpinned region 45 for the device shown in FIG. 6B as compared to the device shown in FIG. 6A. The source implant resulting in unpinned region 45 is typically shallower than the more lightly doped photodiode implant. This capacitance can be minimized in the partially pinned photodiode 30 by making the un-pinned region 45 as small as possible by using self alignment techniques that are well known in semiconductor processing. This is depicted in FIG. 3B. The size of this un-pinned region 45 can be designed to provide the desired lag and linear sensitivity range of linear region 1 as shown in FIG. 7E. Given the same reset gate voltage level, it will take less time to remove the photogenerated electrons from the partially pinned photodiode pixel compared to the standard photodiode pixel. Hence a partially pinned photodiode will have less image lag, (fewer number of electrons left in the photodetector after the reset operation), and can be reset in less time, enabling faster operation.

The partially pinned photodiode based pixel architecture has a fill factor comparable to that of the standard photodiode. Given the same design rules used to layout the pinned photodiode pixel, the fill factor of the partially pinned photodiode can be as much as 2 times larger than the pinned photodiode pixel. This is due to the elimination of the transfer gate and floating diffusion areas, and associated interconnect.

The fill factor advantage of the partially pinned photodiode compared to that of the pinned photodiode is even more evident when viewed with respect to anti-blooming control. Both the pinned and partially pinned photodiode can provide anti-blooming by appropriately biasing the transfer gate or reset gate during integration, to drain away excess photoelectrons. However, in order to provide a means for anti-blooming control for extremely high light levels that could fill up the photodetector during readout of the photodetector, the pinned photodiode pixel must have a separate overflow drain. This could be either a lateral overflow drain and gate, or a vertical overflow drain structure. The lateral overflow drain and gate consumes more photodetector area, thus further reducing the fill factor. Implementation of a vertical overflow drain structure requires additional process steps, increasing process complexity and cost.

With the partially pinned photodiode pixel, anti-blooming control for extremely high light levels can be accomplished without an added overflow drain. The reset drain functions as the overflow drain for the partially pinned photodiode. The level of anti-blooming can be controlled by appropriately controlling the potential of the reset gate. In the case where it is desired to have only a 2-level signal applied to the reset gate, (i.e. on and off), a buried channel reset gate can be employed to set the off potential of the reset gate at an appropriate level that is deeper than zero volts. Alternately, the level of anti-blooming can be controlled by applying the appropriate reset gate voltage, (an intermediate level in between the on and off voltage). This could be done with a surface channel or buried channel reset gate. It should also be noted that a buried channel reset gate eliminates image lag.

This approach to anti-blooming control in a photodiode, pinned photodiode, or partially pinned photodiode pixel 30 has the disadvantage of reducing the charge capacity of the photodetector. This is due to the fact that anti-blooming control is achieved by lowering the electrostatic potential barrier to electrons between the photodetector and the overflow reset drain 18. The partially pinned photodiode pixel 30 has the advantage of being able to incorporate anti-blooming control without reducing the charge capacity of the detector. This is depicted in FIG. 7A–E. The level of anti-blooming protection is typically defined as the ratio of the light level required to produce blooming, (to fill up the entire photodetector in the case of APS and PPS), compared to the light level required to reach the maximum signal in the linear region of the photodetector, (saturation signal or Vsat). For the case where an overflow reset drain 18 is utilized, the level of anti-blooming protection is determined by the resistance of the region between the photodetector and the overflow reset drain 18. For the partially pinned photodiode 30 the electrostatic potential of the reset gate can be left at zero volts and achieve anti-blooming by designing the size of the un-pinned region 45 to provide the desired Vsat. As long as the number of photo-generated electrons is less than or equal to the capacity of the un-pinned region 45, they will all reside in the un-pinned region 45 and produce the linear transfer function 1 shown in FIG. 7B and 7E. As the number of electrons exceed the capacity of the un-pinned region 45, the pinned region 44 begins to fill up with electrons, as shown in FIG. 7C. Since the pinned region 44 has a higher capacitance than the un-pinned region 45, this will produce a second linear transfer function 2 as shown in FIG. 7E. This will continue until the capacity of the pinned region 44 is exceeded, and then electrons will begin to spill over the reset gate 16 into the reset drain 18 or from the diode into other regions of the pixel, (i.e. blooming begins to occur). This is shown in FIGS. 7D and 7E. The level of anti-blooming control, ABX=B/A, is determined and set by the design of the pinned and un-pinned regions. This is also shown in FIG. 7E. It is evident that anti-blooming control is achieved without lowering the electrostatic barrier between the photodetector and the reset drain, thus providing anti-blooming control without sacrificing charge capacity.

Figure 8A:
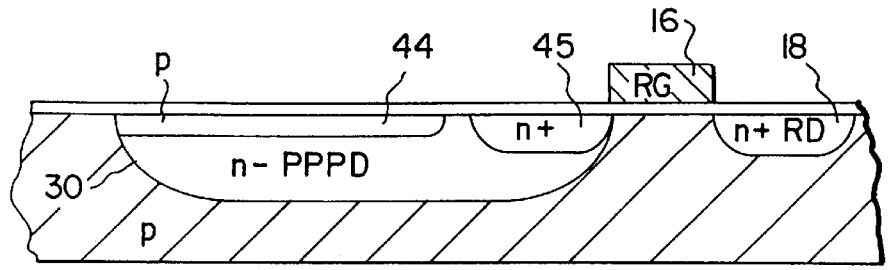
FIG. 8A is a cross sectional diagram of the partially pinned photodiode based pixel as shown in FIG. 4.
Figure 8B:
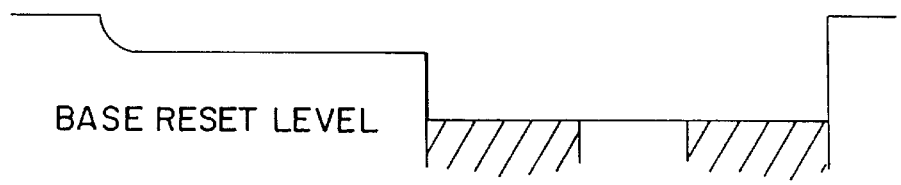
FIG. 8B is an electrostatic potential diagram illustrating the base reset level of the pixel of FIG. 8A.
Figure 8C:
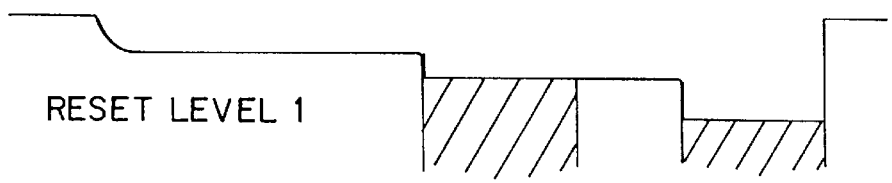
FIG. 8C is an electrostatic potential diagram illustrating a first optional reset level of the pixel of FIG. 8A.
Figure 8D:
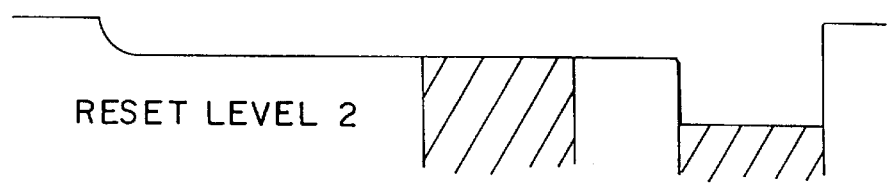
FIG. 8D is an electrostatic potential diagram illustrating a second optional reset level of the pixel of FIG. 8A.
Figure 8E:
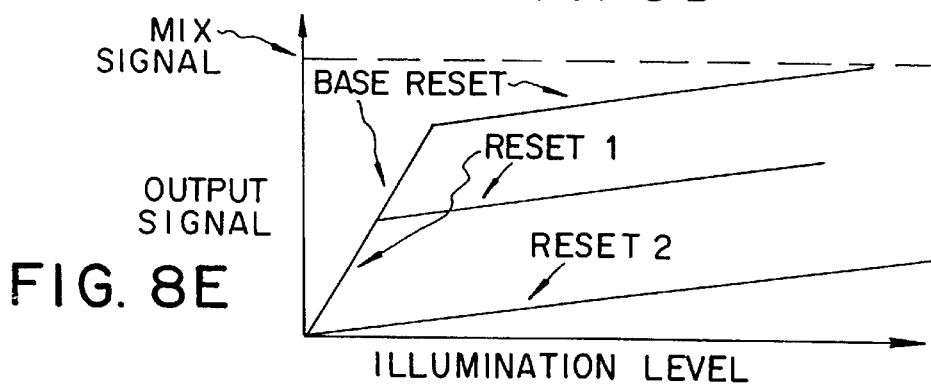
FIG. 8E is a graph of the pixel output signal versus illumination level.

FIG. 8A is a cross sectional diagram of the partially pinned photodiode based pixel as shown in FIG. 4. FIG. 8B is an electrostatic potential diagram illustrating the base reset level of the pixel of FIG. 8A. FIG. 8C is an electrostatic potential diagram illustrating a first optional reset level of the pixel of FIG. 8A. FIG. 8D is an electrostatic potential diagram illustrating a second optional reset level of the pixel of FIG. 8A. FIG. 8E is a graph of the pixel output signal versus illumination level. The partially pinned photodiode 30 also provides dynamic range compression by utilizing the second linear transfer region. This is useful in scenes or images where there is a large range of brightness in the image and detail in both the low light and high light portions of the scene. Without this compression, all detail in the bright region would be lost due to being clipped at the saturation signal level. Control of the onset of the second linear transfer region can be done in two ways. The first method is by appropriately designing the size and capacitance of the un-pinned region 45 and the size and capacitance of the transistor that the diode is connected to (see FIG. 4). The second method consists of controlling the reset gate 16 signals so that the photodiode 30 is reset to the desired level. These 2 methods can be used together. This is shown in FIGS. 8A through 8E with various reset levels determined by reset gate 16. FIG. 8E gives a graphical analysis of reset levels interim of the output signal versus the illumination level.

Figure 9A:
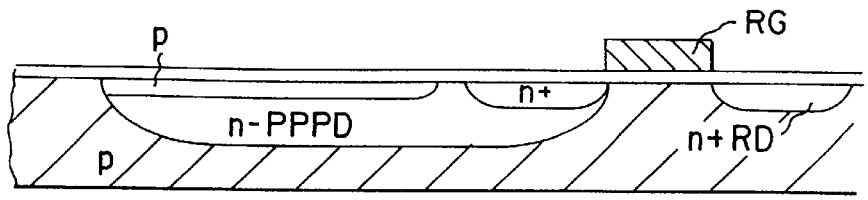
FIG. 9A is cross sectional diagram of the partially pinned photodiode shown in FIG. 4 with a corresponding electrostatic potential.
Figure 9B:
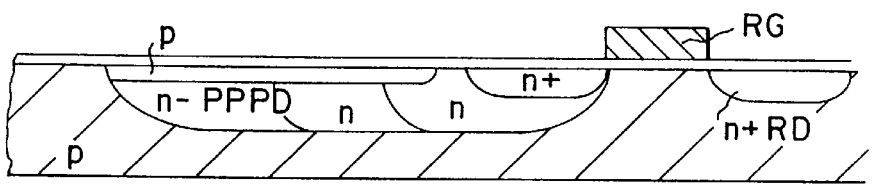
FIG. 9B is a cross sectional diagram of a partially pinned photodiode with multiple implants to generate an electric field with a corresponding electrostatic illustrating an electric field built to assist in fast reset employing a staircase effect.
Figure 9D:
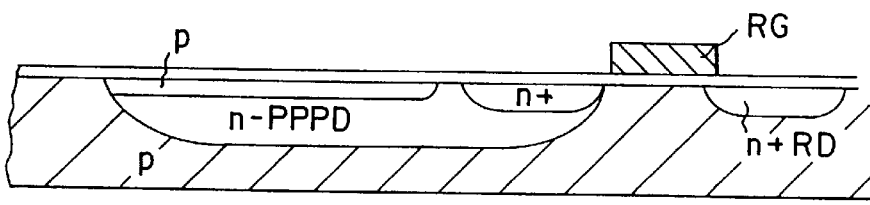
FIG. 9D is a cross sectional diagram of a partially pinned photodiode of FIG. 9C with a corresponding electrostatic illustrating an electric field built to assist in fast reset employing a staircase effect.
Figure 9C:
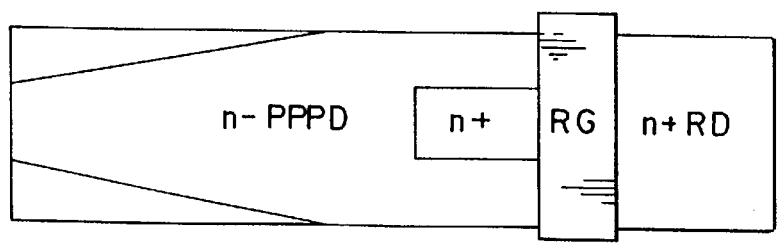
FIG. 9C is a top view of a partially pinned photodiode having tapered implants or tapering active area.

In order to provide fast reset rates it is also necessary to ensure quick transit of any photoelectrons that reside in the pinned region 44 of the photodiode onto the un-pinned region 45. One method of doing this is to build in an electric field that will force them into the un-pinned region. This is normally not the case. The electrostatic potential of pinned region is a constant. This is shown in FIG. 9A. The electric field can be produced in several ways. One way is to provide separate n-type or p-type implants that are offset to produce a staircase effect as shown in FIG. 9B. Another method is to taper the existing n-photodiode implant, p-type pinning layer implant, or any additional n or p-type implants to cause a 2-dimensional modulation of the electrostatic potential. One of these is shown in FIG. 9C. Another method is to taper the active area of the photodiode to produce a similar effect, as shown in FIG. 9.

The invention has been described with reference to a preferred embodiment; However, it will be appreciated that variations and modifications can be effected by a person of ordinary skill in the art without departing from the scope of the invention.

| PARTS LIST: | |
|---|---|
| 5 | prior art pixel |
| 10 | pinned photodiode |
| 12 | transfer gate |
| 14 | floating diffusion |
| 16 | reset gate |
| 18 | reset drain |
| 19 | surface of substrate |
| 20 | substrate |
| 22 | lightly doped n-type region |
| 24 | p-type pinning layer |
| 30 | photodiode |
| 32 | n-type implant for photodiode |
| 34 | p-type pinning layer for partially pinned photodiode |
| 35 | pixel of the present invention |
| 37 | n-type floating region |
| 44 | pinned region of partially pinned photodiode |
| 45 | unpinned region of partially pinned photodiode |
| 46 | contact |
| 50 | passive pixel sensor |
| 54 | pinned region |
| 55 | unpinned region |
| 57 | select gate |
| 59 | drain |

We claim:

1. An image sensor having at least one pixel comprising:
   a semiconductor of a first conductivity type within the sensor, the semiconductor being formed on a surface of the sensor;
   at least one photodiode formed, within the semiconductor near the surface, the photodiode being formed from a second conductivity type opposite the first conductivity type;
   a pinning layer formed on the surface over at least a portion of the photodiode creating a pinned photodiode region, the pinning layer being formed from the first conductivity type;
   an unpinned region formed within the photodiode near the surface in an area outside the portion used to form the pinning layer; and an electrical node formed at the surface within at least the unpinned region interfacing the photodiode to external circuitry using the unpinned region as a sense node.

2. The image sensor of claim 1 further comprising a control circuit operatively coupled to the pixel.

3. The image sensor of claim 1 further comprising reset means for removing charge from the photodiode portion to a drain area.

4. The image sensor of claim 3 wherein the reset means further comprises a buried channel reset gate.

5. The image sensor of claim 1 wherein the semiconductor formed on the surface is a well structure.

6. The image sensor of claim 5 further comprising a vertical overflow drain for removing charge from the photodiode portion to a drain.

7. The image sensor of claim 1 wherein the semiconductor of the first conductivity type formed on the surface is a substrate.

8. The image sensor of claim 1 wherein the unpinned region is formed having a layer of the second conductivity type at the surface.

9. The image sensor of claim 1 where the first conductivity type is p-type.

10. The image sensor of claim 1 where the first conductivity type is n-type.

11. The image sensor of claim 1 wherein the sensor is an active pixel sensor and the unpinned region is a floating region that functions as a capacitor that is operatively coupled to a transistor.

12. The image sensor of claim 11 wherein the transistor is operatively coupled to CMOS control circuitry.

13. The image sensor of claim 1 wherein the sensor is a passive pixel sensor and the unpinned region is a floating region that functions as a capacitor that is operatively coupled to a signal buss.

14. The image sensor of claim 13 further comprising reset means for removing charge from the photodiode to a drain.

15. The image sensor of claim 14 wherein the reset means further comprises a buried channel reset gate.

16. The image sensor of claim 1 wherein the pinned photodiode region further comprises a gradient dopant level formed to create an electrostatic gradient capable of pushing electrons towards the unpinned region.

17. The image sensor of claim 1 wherein the pinned photodiode region further comprises at least one tapered implant.

18. The image sensor of claim 1 wherein the pinned photodiode region further comprises at least one tapered diffused region.

19. The image sensor of claim 1 wherein the pinned photodiode region further comprises a tapered active area.

20. The image sensor of claim 1 further comprising utilization means for facilitating dynamic range compression operation of the sensor.

21. The image sensor of claim 20 wherein the means to utilize further comprises means for controlling the reset gate signal.

22. The image sensor of claim 1 further comprising the pixels being separately addressable.

23. The image sensor of claim 1 wherein the control circuitry is selected from one of either CMOS, PMOS, NMOS.

24. The image sensor of claim 1 wherein the reset means further comprises a reset gate and reset drain.

25. The image sensor of claim 1 wherein the reset means further comprises a vertical overflow drain.

26. The image sensor of claim 1 further comprising antiblooming means for facilitating a region having higher charge capacity.

* * * * *